(12) United States Patent
Siek

(10) Patent No.: US 7,180,802 B2
(45) Date of Patent: *Feb. 20, 2007

(54) METHOD OF STRESS-TESTING AN ISOLATION GATE IN A DYNAMIC RANDOM ACCESS MEMORY

(75) Inventor: David D. Siek, Boise, ID (US)

(73) Assignee: Micron Technology, Inc., Boise, ID (US)

(*) Notice: Subject to any disclaimer, the term of this patent is extended or adjusted under 35 U.S.C. 154(b) by 22 days.

This patent is subject to a terminal disclaimer.

(21) Appl. No.: 11/171,872

(22) Filed: Jun. 30, 2005

(65) Prior Publication Data

US 2005/0236657 A1 Oct. 27, 2005

Related U.S. Application Data

(60) Division of application No. 10/974,495, filed on Oct. 26, 2004, now Pat. No. 6,999,362, which is a division of application No. 10/837,047, filed on Apr. 30, 2004, now Pat. No. 6,870,750, which is a continuation of application No. 10/439,729, filed on May 16, 2003, now Pat. No. 6,735,132, which is a continuation of application No. 09/912,245, filed on Jul. 23, 2001, now Pat. No. 6,590,817.

(51) Int. Cl.
*G11C 7/00* (2006.01)
(52) U.S. Cl. ............ 365/201; 365/190; 365/200
(58) Field of Classification Search ............ 365/201, 365/149, 191, 51, 63, 190, 200
See application file for complete search history.

(56) References Cited

U.S. PATENT DOCUMENTS

| | | | |
|---|---|---|---|
| 5,303,193 A | 4/1994 | Ogihara | 365/201 |
| 5,500,815 A | 3/1996 | Takase et al. | 365/149 |
| 5,638,318 A | 6/1997 | Seyyedy | 365/145 |
| 5,666,323 A | 9/1997 | Zagar | 365/233 |
| 5,677,865 A | 10/1997 | Seyyedy | 365/145 |
| 5,680,344 A | 10/1997 | Seyyedy | 365/145 |
| 5,700,733 A | 12/1997 | Manning | 438/439 |
| 5,754,075 A | 5/1998 | Oh et al. | 327/536 |
| 6,011,726 A | 1/2000 | Batson et al. | 365/188 |
| 6,118,713 A | 9/2000 | Raad | 365/190 |
| 6,169,696 B1 | 1/2001 | Bissey | 365/201 |
| 6,192,495 B1 | 2/2001 | Totorica et al. | 714/718 |
| 6,202,179 B1 | 3/2001 | Morzano | 714/710 |

(Continued)

*Primary Examiner*—Richard T. Elms
*Assistant Examiner*—Hien N Nguyen
(74) *Attorney, Agent, or Firm*—Wells St. John, P.S.

(57) ABSTRACT

The present invention includes a DRAM array. The DRAM array includes a first memory cell, a second memory cell and an isolation gate formed between the first and second memory cells. The isolation gate is configured to provide electrical isolation between the first and second memory cells. The DRAM also includes a first switch having first and second load electrodes and a control electrode configured to accept a first control signal. The first load electrode is coupled to the isolation gate and the second load electrode is coupled to ground. The DRAM additionally includes a second switch having first and second load electrodes and a control electrode configured to accept a second control signal. The first load electrode is coupled to the isolation gate and the second load electrode is coupled to a stress voltage source.

6 Claims, 4 Drawing Sheets

U.S. PATENT DOCUMENTS

| | | | |
|---|---|---|---|
| 6,212,114 B1 | 4/2001 | Cowles | 365/201 |
| 6,233,185 B1 | 5/2001 | Beffa et al. | 365/201 |
| 6,590,817 B2 * | 7/2003 | Siek | 365/201 |

* cited by examiner

METHOD OF STRESS-TESTING AN ISOLATION GATE IN A DYNAMIC RANDOM ACCESS MEMORY

CROSS-REFERENCE TO RELATED APPLICATION

This is a divisional of U.S. patent application Ser. No. 10/974,495, filed Oct. 26, 2004 now U.S. Pat. No.6,999,362, which in turn is a divisional of U.S. patent application Ser. No. 10/837,047, filed Apr. 30, 2004, now U.S. Pat. No. 6,870,750, which is a continuation of U.S. patent application Ser. No. 10/439,729, filed May 16, 2003, now U.S. Pat. No. 6,735,132, which in turn is a continuation of U.S. patent application Ser. No. 09/912,245, filed Jul. 23, 2001, now U.S. Pat. No. 6,590,817, all of which are incorporated herein by reference.

TECHNICAL FIELD

This invention relates generally to a DRAM array with apparatus for stress testing an isolation gate and method.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to electrically isolate devices built into the substrate from one another. Electrical isolation of devices as circuit density increases is a continuing challenge.

One method of isolating devices involves the formation of a semi recessed or fully recessed oxide in the non active (or field) area of the substrate. These regions are typically termed as "field oxide" and are formed by LOCal Oxidation of exposed Silicon, commonly known as LOCOS. One approach in forming such oxide is to cover the active regions with a layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet ($H_2O$) oxidation, typically at atmospheric pressure and at temperatures of around 1000° C., for two to four hours. This results in field oxide growth where there is no masking nitride.

However, LOCOS structures do not necessarily lend themselves to progressively smaller feature sizes and/or increased densities. This is discussed to some extent in U.S. Pat. No. 5,700,733, filed on Jun. 27, 1995, entitled "Semiconductor Processing Methods Of Forming Field Oxide Regions On A Semiconductor Substrate" and issued to M. Manning, the disclosure of which is incorporated herein by reference for its teachings and which is assigned to the assignee of this patent document.

The above-noted patent presents a technique for using shallow trench isolation (STI) to realize a compact and robust DRAM cell having an area of $8F^2$. However, increasing demand for yet more compact and robust memory designs has continued to drive demand for even smaller cell areas.

Another alternative isolation technique uses an isolation gate structure formed between adjacent memory cells. The isolation gate structure is biased to greatly reduce the number of mobile charge carriers in the semiconducting material beneath the isolation gate structure. This architecture has the advantage of providing extremely compact memory cells having an effective area of about $6F^2$ (compared, for example, to an area of about $8F^2$ for the LOCOS structures described above), resulting in a compact memory device. However, conventional isolation gate structures provide leakage charge which flows, at least in part, into the storage nodes of the memory device. The leakage charge, in turn, is a limiting factor in storage times between refresh cycles. Further, some types of defects not easily identified in normal testing regimes can limit the lifetime of the isolation structure and thus of the memory array formed using the isolation structure.

Additionally, for many gate-isolated DRAM structures, it may be necessary to use double row redundancy for replacement of rows of memory cells that include defects. This arises because a row that has been replaced, and thus includes storage nodes that are not being periodically refreshed or otherwise actively biased, includes memory cells that float to various voltages. In turn, this can cause a memory cell in a row that is separated from the row that has been replaced by only one isolation gate to behave inappropriately. As a result, at least some DRAMs employing isolation gates between some rows of memory cells also use an arrangement whereby both the row of memory cells that includes one or more defects, and the neighboring row that is isolated from that row by the isolation gate, are replaced with a pair of redundant rows of memory cells. In turn, this causes the DRAM integrated circuit to be larger than might be the case if other replacement arrangements for rows of memory cells that are defective were practicable.

Needed are apparatus and methods for improving robustness of isolation structures for improved, compact memory cells and memory cell arrays.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
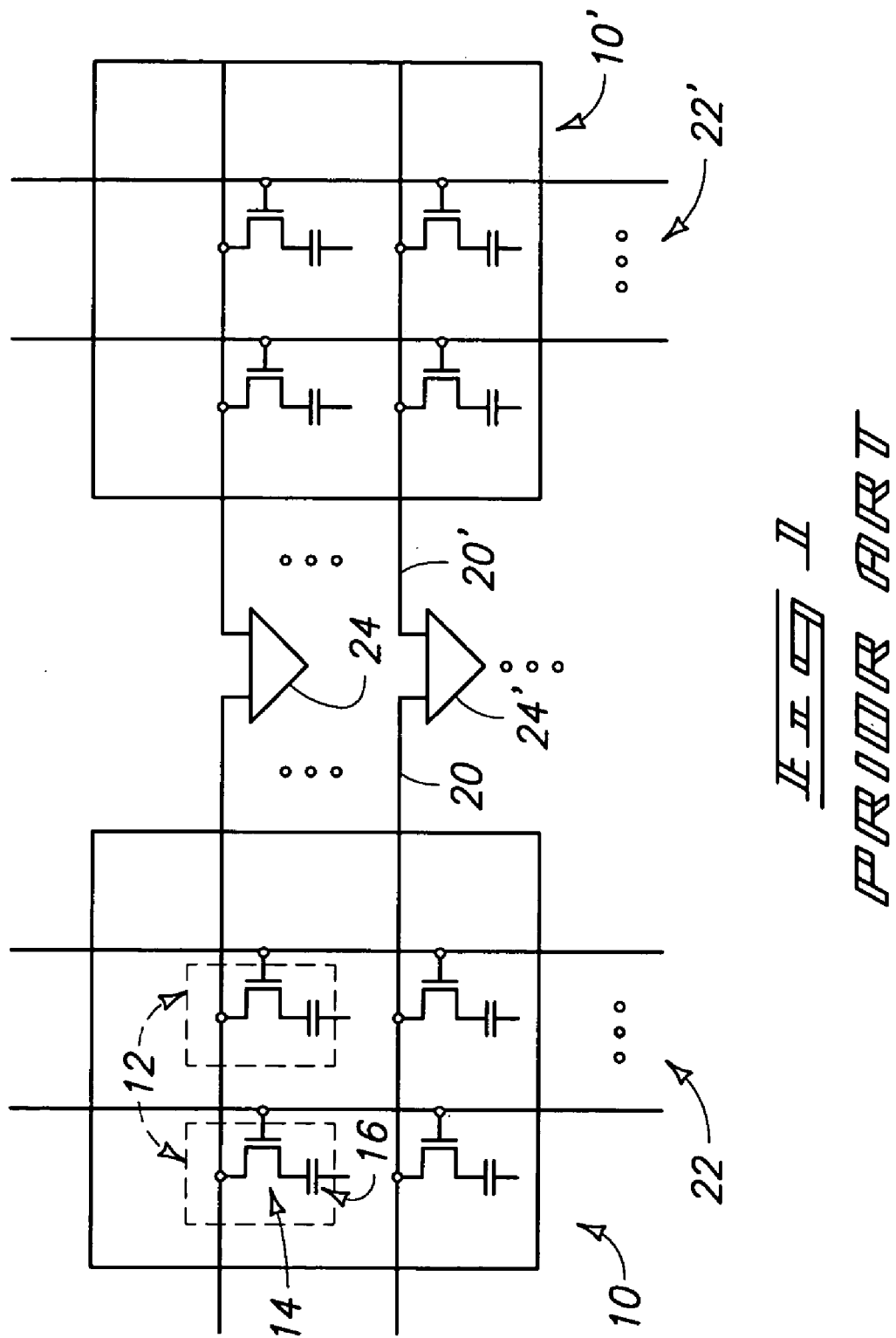
FIG. 1 is a simplified schematic diagram describing an exemplary pair of memory arrays in an open bitline configuration and employing memory cells formed from one transistor and one capacitor, in accordance with the prior art.

FIG. 1 is a simplified schematic diagram describing a pair of memory arrays 10, 10' in an open bitline configuration, each employing memory cells 12 formed from one transistor 14 and one capacitor 16, in accordance with the prior art. It will be appreciated that other types of access devices 14 having a control electrode and one or more load electrodes may be employed.

The memory arrays 10, 10' are each coupled to respective groups of bitlines 20, 20' and respective groups of wordlines 22, 22'. The two groups of bitlines 20, 20' are coupled, one from each of the memory arrays 10, 10', to sense amplifiers 24, 24'. The sense amplifiers 24, 24' comprise peripheral circuitry, i.e., circuitry employed in support of the memory arrays 10, 10' and generally formed outside of peripheries of the memory arrays 10, 10'.

In operation, one memory cell 12 is selected, for example, when two wordlines 22, 22' and one bitline 20 are activated. The wordlines 22 and 22' are each coupled to a respective gate electrode of a respective one of the transistors 14 and the bitline 20 is coupled to a load electrode of one of these transistors 14. That transistor 14 is then turned ON, coupling charge stored in the capacitor 16 to the associated bitline 20. The sense amplifier 24 or 24' then senses the charge coupled from the capacitor 16 to the bitline 20, compares that signal to a reference signal such as a reference charge $Q_{REF}$ or reference voltage coupled to a corresponding bitline 20', amplifies the resulting signal and latches the amplified signal for an appropriate duration. This allows data represented by the charge stored in the capacitor 16 to be accessed external to the memory arrays 10, 10' and also allows the capacitor 16 to store charge representative of the data from the memory cell 12 back into that memory cell 12.

Many types of memories use sense amplifiers 24, 24' that pre-charge the bitlines 20 to a predetermined reference voltage level, usually about one-half of a power supply voltage $V_{CC}$. However, in some types of memories, this is not possible for any of a number of technical reasons. In some of these types of memories, a reference charge $Q_{REF}$ is generated for comparison purposes as described above. Choosing an appropriate magnitude of the reference signal 16 allows optimal dynamic range and maximizes charge storage times consistent with the power supply voltage $V_{CC}$.

Sense amplifiers similar to the sense amplifiers 24, 24' of FIG. 1 are described, for example, in U.S. Pat. No. 5,680,344, entitled "Circuit And Method Of Operating A Ferroelectric Memory In A DRAM Mode", in U.S. Pat. No. 5,638,318, entitled "Ferroelectric Memory Using Ferroelectric Reference Cells", and in U.S. Pat. No. 5,677,865, entitled "Ferroelectric Memory Using Reference Charge Circuit", all issued to M. Seyyedy and assigned to the assignee of this patent document, which patents are hereby incorporated herein for their teachings. Other suitable types of sense amplifiers may also be employed for the sense amplifiers 24, 24' of FIG. 1. It will be appreciated that elements formed in the sense amplifiers 24, 24' and other circuitry, within or outside of the memory arrays 10, 10', may employ transistors having characteristics, designs and gate thicknesses that may differ from those employed in defining the memory cells 12.

Figure 2:
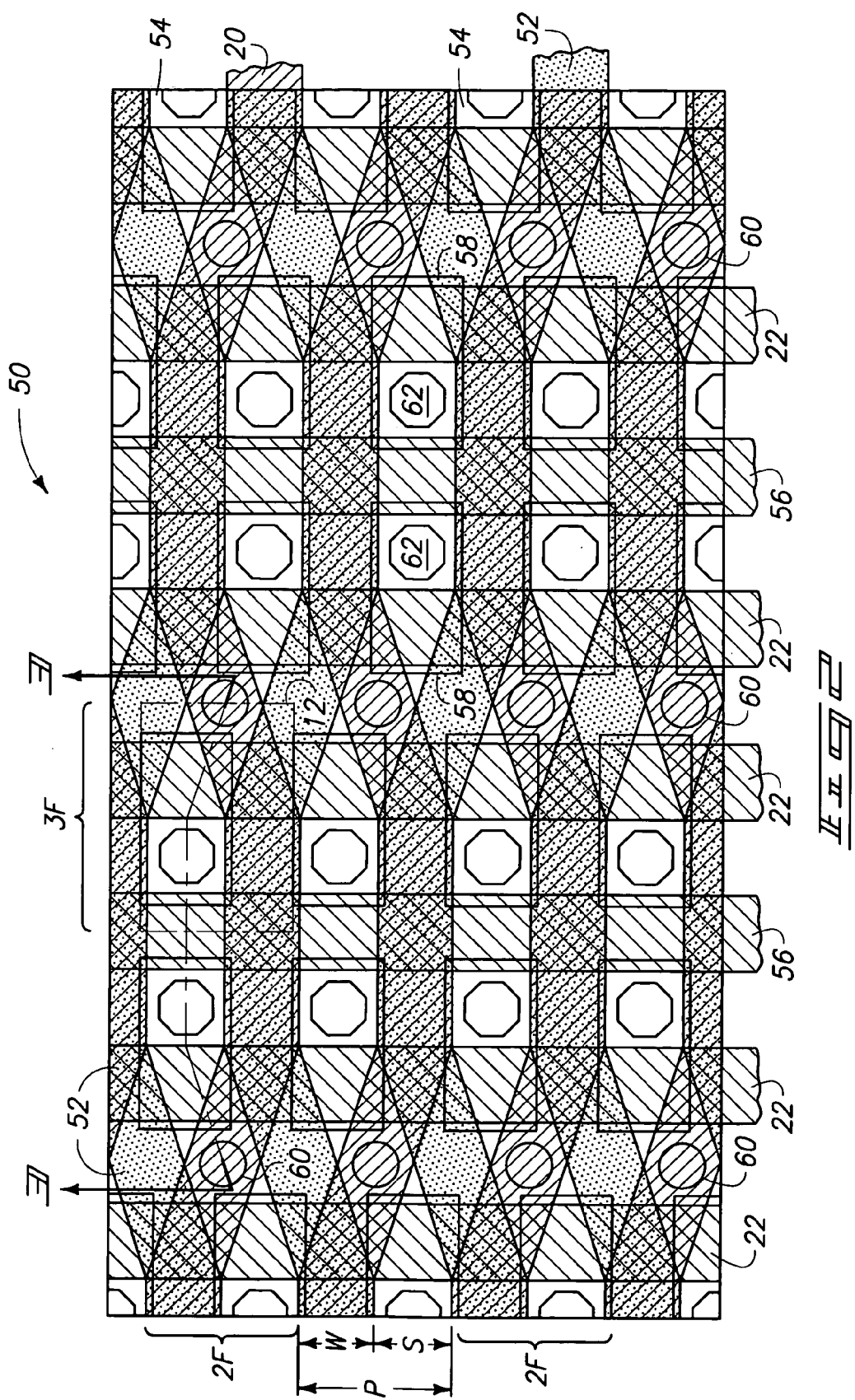
FIG. 2 is a simplified plan view of a circuit layout for a $6F^2$ memory array, in accordance with an embodiment of the present invention.

FIG. 2 is a simplified plan view of a portion of a circuit layout for a $6F^2$ memory array 50, in accordance with an embodiment of the present invention. The memory array 50 corresponds to the memory arrays 10, 10' of FIG. 1.

Shallow trench isolation (STI) areas 52 are represented as stippled areas following a serpentine path across the memory array 50, with active areas 54 intervening between adjacent STI areas 52. Active areas 54 are shown as areas that are void of the stippling denoting the STI areas 52.

Bitlines 20, shown as hatched areas, also follow a serpentine path across the memory array 50, but are typically formed much later in processing than the STI areas 52. Wordlines 22 (FIG. 1) extend along an axis intersecting the STI areas 52 and the bitlines 20, and extend across portions of the active areas 54 where the wordlines 22 form gates of access devices or transistors 14 (FIG. 1).

The memory array 50 also includes isolation gates 56 interspersed between selected ones of the wordlines 22. The memory array 50 further includes capacitor containers 58, represented as rectangles, and bitline contacts 60, represented as circles. Container capacitors formed within the capacitor containers 58 are coupled to the active areas via storage node contacts 62, represented as octagons at one end of each of the capacitor containers 58. In one embodiment, the storage node contacts 62 comprise conductive material extending to selected portions of the active area 54. While the access devices 14 from FIG. 1 are not explicitly shown in FIG. 2 for clarity of illustration and ease of understanding, each access device 14 includes, e.g., a bitline contact 60, an adjacent wordline 22 and an adjacent storage node contact 62. The bitline contact 60 and storage node contact 62 correspond to load electrodes of the access device 14, while the wordline 22 corresponds to a control electrode.

A cell plate (not shown) formed of a conductive material such as doped polysilicon extends across tops of the capacitor containers 58 and forms a common electrode or signal ground for capacitors formed within the capacitor containers 58. The isolation gates 56 are configured to isolate adjacent ones of the storage node contacts 62.

Each memory cell 12 (FIG. 1) within the memory array 50 includes part of one of the bitline contacts 60 (these are shared by adjacent memory cells 12), a storage node contact 62, a portion of one active area 54, a portion of one isolation gate 56 and a portion of one STI area 52 and is bounded on one side by a corresponding portion of another STI area 52. Isolation between storage node contacts 62 formed in a common portion of an active area 54 that includes one of the bitline contacts 60 results because only one of the pair of wordlines 22 traversing the common portion of active area 54 is turned "ON" at any one time.

As a result, the architecture shown in FIG. 2 provides a compact memory cell having an area less than that of, for example, the previously-discussed LOCOS memory structure. This area is equal to about 3F×2F, or less, where "F" is defined as equal to one half of minimum pitch, with minimum pitch (i.e., "P") being defined as equal to the smallest distance of a line width (i.e., "W") plus width of a space immediately adjacent said line on one side of said line between said line and a next adjacent line in a repeated pattern within the array (i.e., "S"). Thus, in the preferred implementation, the consumed area of a given memory cell 12 is no greater than about $6F^2$.

In all DRAMs, the charge stored in the capacitors 16 (FIG. 1) must be read out, amplified and then written back into the capacitors 16, which operations are collectively referred to as a "refresh" cycle. The isolation gates 56 contribute to leakage currents that, in turn, provide charge to the capacitors 16 (not illustrated in FIG. 2) formed in the capacitor containers 58. As a result, the memory array 50 must be refreshed more frequently than might otherwise be the case. This, in turn, increases power dissipation by the memory array 50 and also reduces maximum data availability.

Figure 3:
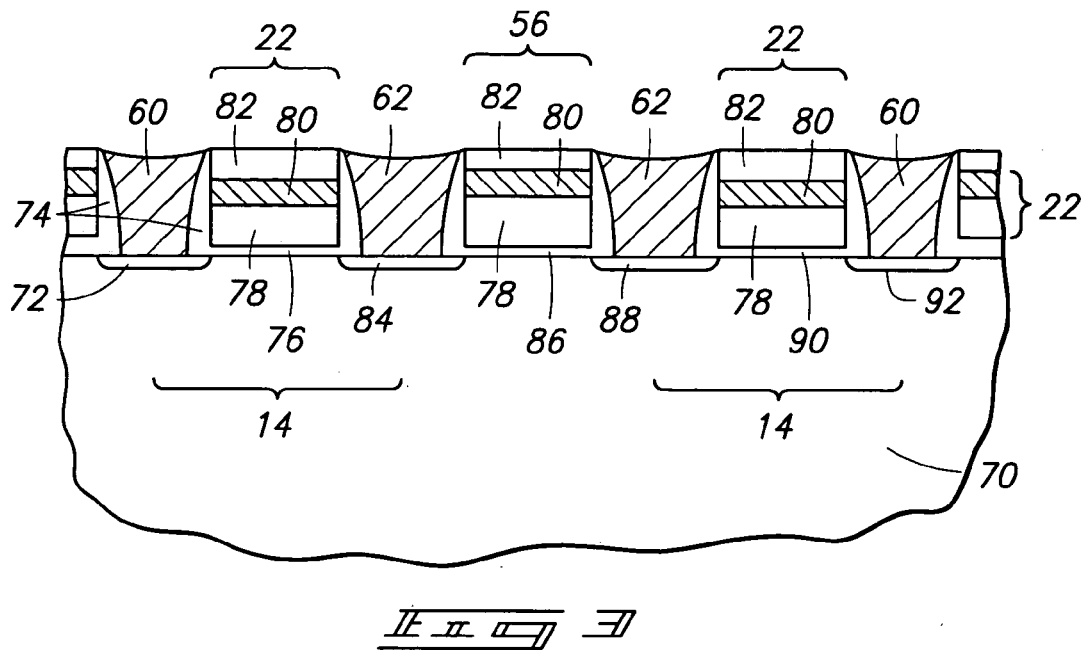
FIG. 3 is a simplified cross-sectional view, taken along lines 3—3 of FIG. 2, of several memory cells of the memory array of FIG. 2, in accordance with an embodiment of the present invention.

FIG. 3 is a simplified cross-sectional view, taken along lines 3—3 of FIG. 2, of several memory cells of the memory array 50 of FIG. 2, in accordance with an embodiment of the present invention. Structures shown in FIG. 3 are formed on top of a semiconductive substrate 70 (such as monocrystalline silicon). In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

At the far left of FIG. 3, a first diffusion region 72 is shown that is coupled to one of the bit line contacts 60. In one embodiment, the bitline contact 60 is formed from conventional polysilicon and is insulated from laterally adjacent structures by a conventional dielectric sidewalls 74.

A first one of the wordlines 22 is shown adjacent to the first diffusion region 72, and is separated from the substrate 70 by a first gate dielectric 76. In one embodiment, the wordline 22 is formed from conventional polysilicon 78 and metal silicide 80 and is insulated from structures formed atop the wordline by a conventional dielectric capping layer 82.

A second diffusion region 84 is shown adjacent the first one of the wordlines 22, and is coupled to one of the storage node contacts 62. In one embodiment, the storage node contact 62 is formed from conventional polysilicon and is insulated from laterally adjacent structures by conventional dielectric sidewalls 74.

The first 72 and second 84 diffusion regions and the first one of the wordlines 22 together with the first gate dielectric 76 form one of the access devices 14 of FIG. 1.

One of the isolation gates 56 is shown adjacent the second diffusion region 84 and is separated from the substrate 70 by a gate dielectric 86. A third diffusion region 88 is shown adjacent the isolation gate 56, and is coupled to another one of the storage node contacts 62. The second diffusion region 84, third diffusion region 88 and isolation gate 56 collectively form an isolation transistor, with the diffusion regions 84 and 88 corresponding to load electrodes of the isolation transistor.

A second one of the wordlines 22 of FIG. 2 is shown adjacent the third diffusion region 88 and is separated from the substrate by a third gate dielectric 90. A fourth diffusion region 92 is shown adjacent the second one of the wordlines 22 and is coupled to another one of the bitline contacts 60 of FIG. 2. The third 88 and fourth 92 diffusion regions and the second wordline 22 together with the third gate dielectric 90 form another of the access devices 14 of FIG. 1.

The isolation gate 56 is tied to a low voltage, such as $V_{SS}$ (ground) or a more negative voltage, e.g., $V_{BB}$ (a voltage corresponding to the bulk of the semiconductor wafer or to a p-well voltage) during normal operation. As a result, the portion of the active area 54 (FIG. 2) between adjacent storage node contacts 62 corresponds to an isolation transistor that is normally turned OFF, providing electrical isolation between the two adjacent storage node contacts 62.

Figure 4:
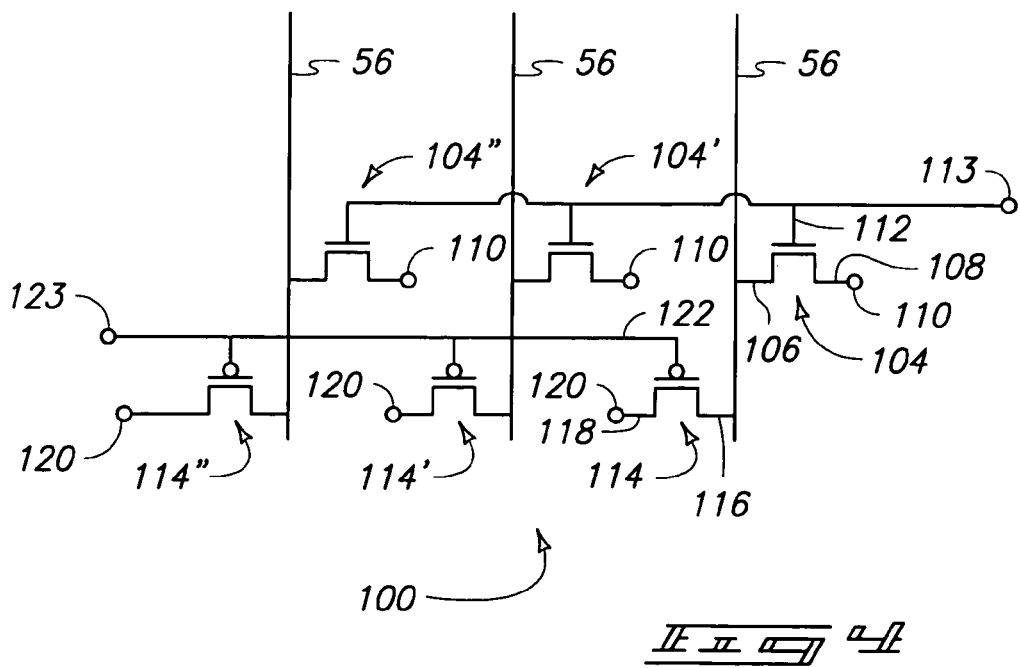
FIG. 4 is a simplified schematic diagram of a circuit for switching to and from a test mode of operation, in accordance with an embodiment of the present invention.

FIG. 4 is a simplified schematic diagram of a circuit 100 for switching to and from a test mode of operation, in accordance with an embodiment of the present invention. The circuit 100 includes a plurality of the isolation gates 56 of FIG. 3, a first switch 104 having a first load electrode 106 coupled to at least one of the isolation gates 56, a second load electrode 108 coupled to a voltage source 110 capable of turning the isolation gate 56 OFF and a control electrode 112 configured to accept a control signal from a control signal source 113. The circuit 100 also includes a second switch 114 having a first load electrode 116 coupled to at least one of the isolation gates 56, a second load electrode 118 coupled to a voltage source 120 capable of voltage stressing the isolation gate 56 and a control electrode 122 configured to accept a second control signal from a second control signal source 123.

In one embodiment, the first switch 104 comprises at least one NMOS transistor having a drain 106, a source 108 and a gate 112. In one embodiment, separate switches 104, 104', 104" etc. and 114, 114', 114" etc. are employed for each of the isolation gates 56. In one embodiment, groups of isolation gates 56 are coupled together to a common first switch 104. In one embodiment, the second switch 114 comprises a PMOS transistor having a drain 116, a source 118 and a gate 120. In one embodiment, the voltage source 110 comprises $V_{SS}$ or ground. In one embodiment, the voltage source 110 comprises $V_{BB}$. In one embodiment, the voltage source 120 comprises a positive voltage. In one embodiment, the voltage source 120 comprises a positive power supply voltage. In one embodiment, the voltage source 120 comprises $V_{CC}$ or $V_{DD}$.

In normal operation, the first switch 104 is turned ON and the second switch 114 is turned OFF. As a result, the isolation gate 56 is turned OFF and the adjacent memory cells 12 are electrically isolated from each other.

During production testing, it is desirable to identify DRAM devices having isolation gates 56 that are susceptible to failure during the course of normal operation. A variety of different kinds of manufacturing defects can give rise to failure of the isolation gates 56. At least some of these manufacturing defects can have their failure mode accelerated by voltage stressing the isolation gates 56 by applying a voltage greater than what would ordinarily be expected during normal operation. As a result, at least some of those manufacturing defects may be detected by voltage stressing the isolation gates 56 and then executing normal performance testing of the DRAM.

This is accomplished by first turning the first switch 104 OFF and then turning the second switch 114 0N. The second switch 114 is left ON for a predetermined interval and then is turned OFF. To execute performance testing, the first switch 104 is turned ON while the second switch 114 is turned OFF.

Figure 5:
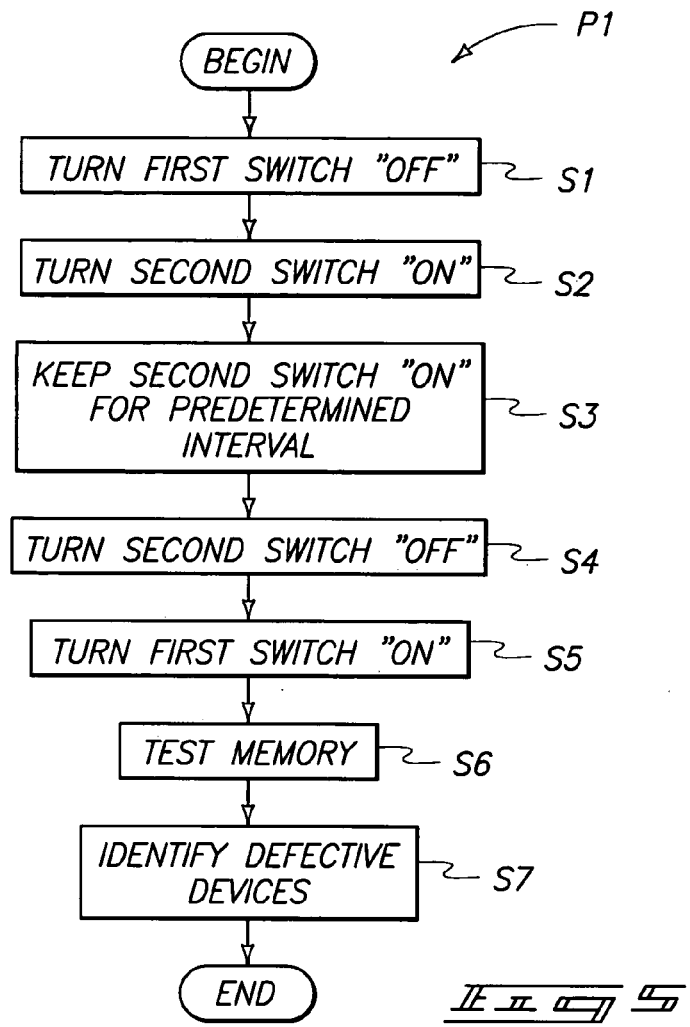
FIG. 5 is a simplified flow chart of a process for stress testing the isolation gate structures of FIG. 3, in accordance with an embodiment of the present invention.

FIG. 5 is a simplified flow chart of a process P1 for stress testing the isolation gate structures of FIG. 3, in accordance with an embodiment of the present invention. The process P1 begins in a step S1.

In the step S1, the first switch 104 is turned OFF.

In a step S2, the second switch 114 is turned ON.

In a step S3, the second switch 114 is kept ON for a predetermined interval. In one embodiment, the predetermined interval is about ten milliseconds, although longer or shorter intervals could also be employed. In one embodiment, the predetermined interval is about twenty milliseconds.

In a step S4, the second switch 114 is turned OFF.

In a step S5, the first switch 104 is turned ON.

In a step S6, normal production testing is executed.

In a step S7, defective devices are identified and separated from production devices. The process P1 then ends.

Examples of DRAM testing are provided in U.S. Pat. No. 6,212,114, filed on Jun. 1, 2000, entitled "Methods Of Identifying Defects In An Array Of Memory Cells And Related Integrated Circuitry", issued to T. B. Cowles; U.S. Pat. No. 6,202,179, filed on Jun. 15, 1999, entitled "Method And Apparatus For Testing Cells In A Memory Device With Compressed Data And For Replacing Defective Cells", issued to C. K. Morzano; and U.S. Pat. No. 6,192,495, filed on Jul. 10, 1998, entitled "On-Board Testing Circuit And Method For Improving Testing Of Integrated Circuits", issued to R. L. Totorica et al., which patents are assigned to the assignee of the present patent document and which are hereby incorporated herein by reference for their teachings.

Figure 6:
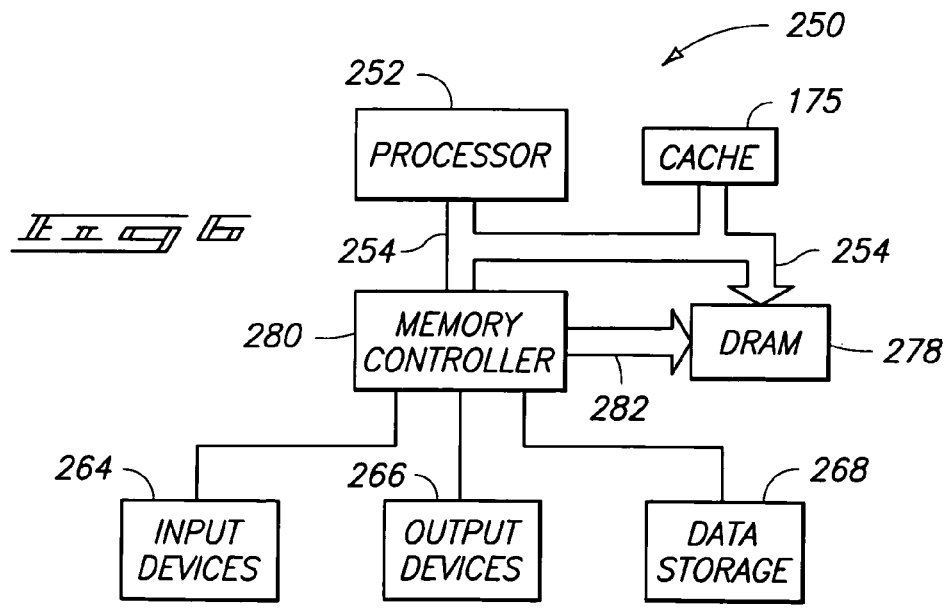
FIG. 6 is a simplified block diagram of a computer system including one or more memories using the isolation gate of FIG. 3 and the circuit of FIG. 4, in accordance with an embodiment of the present invention.

FIG. 6 is a simplified block diagram of a computer system 250 including one or more memories 278 using the isolation gate 56 of FIG. 3 and the circuit 100 of FIG. 4, in accordance with an embodiment of the present invention. The computer system 250 includes a processor 252 for performing various computing functions, such as executing specific software to perform specific calculations or tasks. The processor 252 includes a processor bus 254 that normally includes an address bus, a control bus and a data bus.

In addition, the computer system 250 includes one or more tactile input devices 264, such as a keyboard or a mouse, coupled to the processor 252 to allow an operator to interface with the computer system 250. Typically, the computer system 250 also includes one or more output devices 266 coupled to the processor 252, such output devices typically being a printer or a video terminal. One or more data storage devices 268 are also typically coupled to the processor 252 to allow the processor 252 to store data or retrieve data from internal or external storage media (not shown). Examples of typical storage devices 268 include hard and floppy disks, tape cassettes and compact disk read-only memories (CD-ROMs).

The processor 252 is also typically coupled to cache memory 175, which is usually SRAM 175, by the processor bus 254 and to DRAM 278 through a memory controller 280. The memory controller 280 normally includes a control and address bus 282 that is coupled to the DRAM 278. Forming the DRAM 278 using the isolation gate stress test circuit 100 of FIG. 4 allows the DRAM 278 to have reduced probability of stress failure, increasing the robustness of the overall system 250.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of isolating a single row of memory cells in a DRAM array comprising:
   providing pairs of rows of memory cells;
   providing isolation gates separating pairs of rows, each isolation gate being configured to isolate one of the pair of rows from another of the pair of rows; and
   providing a transistor having a load electrode coupled to the isolation gate, the transistor being configured to supply a predetermined voltage to the isolation gate to isolate one of the pair of rows from another of the pair of rows in response to a control signal.

2. The method of claim 1, wherein providing a transistor comprises providing an n-type transistor having a drain coupled to the isolation gate, a gate configured to accept the control signal and a source configured to be coupled to a ground voltage.

3. The method of claim 2, further comprising providing a second transistor configured to supply a stress voltage to the isolation gate in response to a test mode signal.

4. The method of claim 3, wherein providing a second transistor comprises providing a PMQS transistor having a drain coupled to the isolation gate, a source configured to be coupled to a positive stress voltage and a gate configured to be coupled to the test mode signal.

5. The method of claim 1, further comprising forming the pairs of rows of memory cells, including forming, for respective memory cells, an access transistor and a data storage capacitor on a semiconductive substrate, the access transistor being coupled to the data storage capacitor via a storage node formed on the substrate.

6. The method of claim 5, wherein the isolation gates are formed between storage nodes of memory cells of rows that are being isolated.

* * * * *

UNITED STATES PATENT AND TRADEMARK OFFICE
CERTIFICATE OF CORRECTION

| | | |
|---|---|---|
| PATENT NO. | : 7,180,802 B2 | Page 1 of 1 |
| APPLICATION NO. | : 11/171872 | |
| DATED | : February 20, 2007 | |
| INVENTOR(S) | : Siek | |

It is certified that error appears in the above-identified patent and that said Letters Patent is hereby corrected as shown below:

Col. 6, line 49, please delete "0N." after "switch 114" and insert --ON.--.

Signed and Sealed this

Fourth Day of September, 2007

JON W. DUDAS
*Director of the United States Patent and Trademark Office*